United States Patent
Booth et al.

[11] Patent Number: 5,936,413
[45] Date of Patent: Aug. 10, 1999

[54] METHOD AND DEVICE FOR MEASURING AN ION FLOW IN A PLASMA

[75] Inventors: Jean-Paul Booth, Gieres; Nicholas St. John Braithwaite, Meylan, both of France

[73] Assignee: Centre National de la Recherche Scientifique, Paris, France

[21] Appl. No.: 08/836,036
[22] PCT Filed: Sep. 18, 1996
[86] PCT No.: PCT/FR96/01451
  § 371 Date: Aug. 8, 1997
  § 102(e) Date: Aug. 8, 1997
[87] PCT Pub. No.: WO97/11587
  PCT Pub. Date: Mar. 27, 1997

[30] Foreign Application Priority Data
Sep. 19, 1995 [FR] France .................................. 95 11181

[51] Int. Cl.⁶ .............................. G01N 27/62; G01R 27/26
[52] U.S. Cl. .................... 324/678; 324/464; 315/111.31; 436/153; 250/283
[58] Field of Search ..................................... 324/459, 464, 324/676, 678; 315/111.31; 436/153; 250/283, 284, 290, 293; 156/643.1; 204/298.03, 298.32

[56] References Cited

U.S. PATENT DOCUMENTS

| | | | |
|---|---|---|---|
| 2,696,584 | 12/1954 | Lion et al. | 324/459 X |
| 4,336,532 | 6/1982 | Biehl et al. | 324/459 X |
| 5,339,039 | 8/1994 | Carlile et al. | 324/655 |
| 5,467,013 | 11/1995 | Williams et al. | 324/127 |

*Primary Examiner*—Glenn W. Brown
*Attorney, Agent, or Firm*—Arthur L. Plevy

[57] ABSTRACT

The present invention relates to a method for measuring an ion flow from a plasma to a surface in contact therewith, consisting of measuring the rate of discharge of a measuring capacitor connected between a radiofrequency voltage source and a plate-shaped probe in contact with the plasma.

11 Claims, 2 Drawing Sheets

METHOD AND DEVICE FOR MEASURING AN ION FLOW IN A PLASMA

BACKGROUND OF THE INVENTION

1. Field of the Invention

The present invention relates to a method and device for measuring a flow of positive ions from an ionized gas, or plasma, to a solid surface in contact therewith, for example, a wall of a plasma reactor or a sample to be processed. The present invention more specifically applies to measuring an ion flow in an enclosure constituting a plasma reactor for coating a sample with a thin layer, or modifying the structure or the chemical composition of a surface by ion bombardment.

2. Discussion of the Related Art

FIG. 1 schematically shows, in a cross-sectional view, an example of a plasma reactor to which the present invention applies. It can be, for example, a so-called capacitive coupling radiofrequency excitation reactor.

Such a reactor is made of a vacuum enclosure 1. Close to a first wall 2 of this enclosure 1 is placed, on a wafer support 3, a sample 4 to be processed. Sample 4 is generally shaped as a disk having a surface 8 directed towards the inside of enclosure 1 which constitutes the surface to be processed. Enclosure 1 is filled with a low pressure gas, for example, of around a few tens to a few hundreds of millitorrs (a few tens of pascals). Several means can be used to generate the plasma. For example, in a so-called "capacitive coupling reactive ionic etching" configuration, a radiofrequency voltage is applied to the wafer support. As shown in FIG. 1, the plasma can also be generated by means of a source 6 independent from wafer support 3. This source 6 is, for example, for a d.c. voltage discharge, an electrode independent from the wafer support and supplied by a radiofrequency generator, an inductive coupling radiofrequency source (often associated with the application of a magnetic field) or a microwave source (which may be associated with the application of a magnetic field). In the case of the use of a source 6 independent from wafer support 3, the latter can be biased by a radiofrequency source 5 (FIG. 1) to establish a self-biasing and thus increase the ion impact power on the surface to be processed.

In a plasma etching or deposition method, it is important to know the characteristics of the interaction between the surface to be processed and the plasma to be able to control the implementation of the method, especially, to control the deposition or etching rate, according to the desired thickness of the deposition or depth of the etching. The flow of charged particles (ions and electrons) which arrive and leave the surface to be processed enables to determine these characteristics which depend, notably, on the plasma used.

A so-called induced fluorescence method enables to determine, in certain limited cases, the ion speed distribution function. However, such a method does not allow to definitely determine the ion flow. Moreover, its implementation is particularly complex and very costly.

The present invention applies to a direct electrical measurement of the ion flow in a plasma reactor.

Several methods are conventionally used to determine the characteristics of plasma reactors based on electrical measurements.

A first, so-called "Langmuir probe", method consists in inserting, in the middle of the plasma and thus away from the enclosure walls, a small generally cylinder-shaped electrode. This electrode is connected, outside the enclosure, by a wire surrounded with an insulating sheath. A variable voltage V is applied between the probe and the walls of the reactor and the current I in the wire is measured. The shape of the current-voltage characteristic I(V) thus obtained enables to estimate parameters characteristic of the plasma, such as the ion and electron density, the electron temperature or the plasma potential. With a modeling, these parameters enable to obtain an estimate of the ion flow towards the walls.

A so-called "planar Langmuir probe" alternative of this method consists in placing, next to a wall (for example, wall 9 in FIG. 1) of enclosure 1, an electrode shaped as a disk having a relatively large surface S (for example, a few square cm) with its rear surface directed to the wall coated with an insulating material.

FIG. 2 shows the shape of the current-voltage characteristic of such an electrode in a plasma reactor. When a strongly negative voltage V is applied, a saturation current Isat is reached. This current Isat is an image of the flow of positive ions $\Gamma_{ion}$ since all the electrons are repelled. The relationship which links current Isat to ion flow $\Gamma_{ion}$, assuming that all the ions are ionized only once, is given by relation Isat=e.S.$\Gamma_{ion}$, where e stands for the charge of an electron.

A disadvantage of Langmuir probe methods, which consist in measuring a d.c. current between the probe and the plasma, is that they no longer operate when the probe is contaminated, in particular if the plasma deposits an insulating layer on the electrode. This generally occurs with chemically complex gases ($CF_4$, $SiH_4$, $CH_4$, etc.) which quickly deposit thin insulating layers on any surface in contact with the plasma.

A second method consists in sampling the ion (and electron) flow by means of a small aperture (generally having a diameter of approximately 100 $\mu$m) in an electrode placed in the vicinity of an enclosure wall. An electrostatic filter placed behind the aperture enables one to separate positive ions from electrons and thus to measure the transmitted ion current. A disadvantage of such a method is that it requires a calibration of the transmission rate of the aperture and of the electrostatic filter. Yet, depositions of thin layers on the filter result in an alteration of the rate. The measurements are thus disturbed by these plasma-induced depositions, which makes them quickly unexploitable and results in complete failure of the measurement device.

A consequence of the disadvantages of the methods described hereabove is that conventional plasma reactors are generally characterized by operating with a rare gas, for example argon, previously to any deposition or etching method. The characteristics of a reactor in the presence of a complex gas thus cannot be known otherwise than by modeling.

Another disadvantage common to all known methods is that they do not allow any direct measurement of the ion flow during the processing of a sample. They thus do not allow any control of a deposition or etching method.

SUMMARY OF THE INVENTION

The present invention aims at overcoming these disadvantages by providing a method for measuring an ion flow which can be implemented whatever plasma is used. Specifically, the present invention aims at enabling the measurement of the ion flow in plasmas which deposit thin insulating layers.

The present invention also aims at providing a method which does not disturb the deposition or etching method itself. In particular, the present invention aims at authorizing a control of a plasma deposition or etching method.

The present invention also aims at providing a device for implementing such a method which is of particularly simple implementation.

The present invention also aims at providing a device which does not require a calibration prior to the measurements. In particular, the present invention aims at enabling an absolute measurement of the ion flow.

The present invention further aims at providing a device which enables a measurement of the homogeneity of the ion flow in the vicinity of the wall of the enclosure for receiving a sample to be processed.

To achieve these objects, the present invention provides a method for measuring an ion flow from a plasma to a surface in contact therewith, consisting of measuring the discharge rate of a measuring capacitor connected between a radiofrequency voltage source and a plate-shaped probe in contact with the plasma.

According to an embodiment of the present invention, the measurement method consists of periodically supplying the probe with radiofrequency oscillation trains and performing the measurement, between two oscillation trains, after the damping of the radiofrequency signal and before the potential of the probe is stabilized.

According to an embodiment of the present invention, the measurement method consists of performing a measurement of the potential variation across the measuring capacitor.

According to an embodiment of the present invention, the method consists of measuring the discharge current of the measuring capacitor by means of a transformer interposed between the capacitor and the probe.

According to an embodiment of the present invention, the value of the measuring capacitance is lower than the value of the capacitance of a thin layer which may be expected on the probe.

The present invention also relates to a device for measuring an ion flow in a vacuum enclosure constituting a plasma reactor, including:

- a probe internal to the enclosure and including a planar sensitive surface;
- means external to the enclosure for periodically supplying the probe with a radiofrequency voltage;
- a measuring capacitor external to the enclosure mounted in series between the supplying means and the probe; and
- means external to the enclosure for periodically measuring the discharge current of the measuring capacitor or the potential variations across the capacitor during its discharge.

According to an embodiment of the present invention, the probe is comprised of a disk connected, by a substantially axial conductor, to a terminal of the measuring capacitor, the rear and lateral surfaces of the disk being surrounded with an insulator and a conductive sheath acting as a screen and a guard ring.

According to an embodiment of the present invention, the sheath is connected to the supply source via a capacitor.

According to an embodiment of the present invention, the supplying means are comprised of a radiofrequency voltage source which provides radiofrequency oscillation trains, the measurement being performed between two oscillation trains.

According to an embodiment of the present invention, the period of the radiofrequency oscillations is short with respect to the application time of these oscillations, the application time of the oscillation trains being long enough to establish a self-biasing voltage for the probe and the time interval between two oscillation trains being long enough to enable the measurement.

These objects, characteristics and advantages as well as others, of the present invention, will be discussed in detail in the following non-limiting description of specific embodiments in relation with the accompanying drawings.

DETAILED DESCRIPTION

Figure 5:
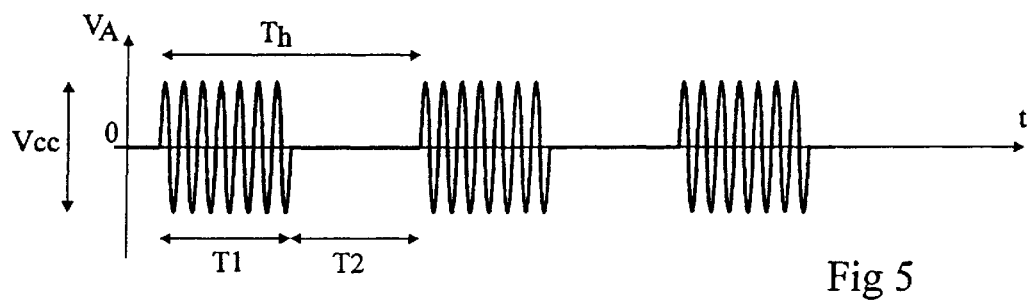
FIGS. 5 and 6 illustrate timing diagrams of the measurement method of an ion flow according the present invention.
Figure 6:
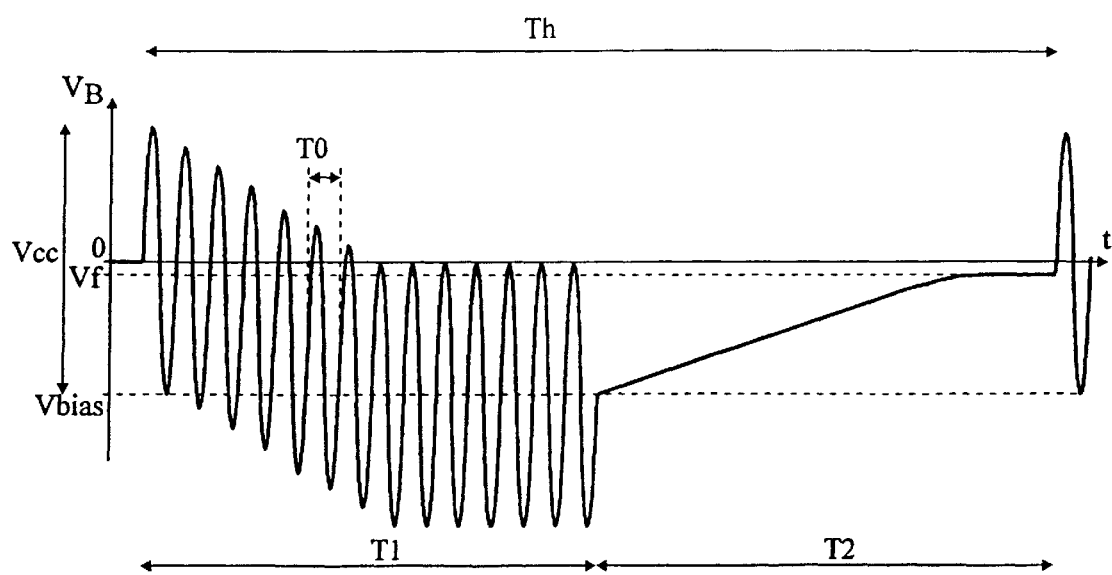

For clarity, only the components of the device according to the present invention and of the plasma reactor which are necessary for the understanding of the present invention have been shown. Similarly, the timing diagrams of FIGS. 5 and 6 are not to scale and the same components have been referred to with the same references in the different drawings.

Figure 3:
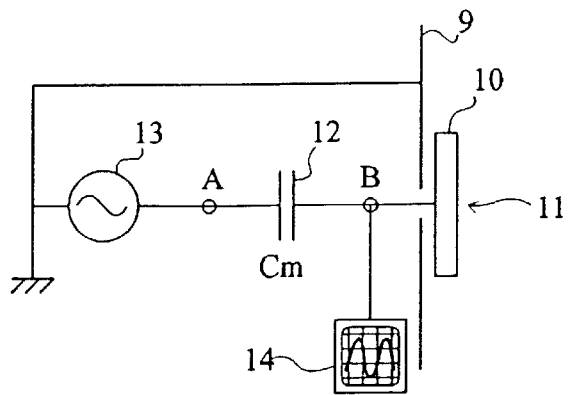
FIG. 3 schematically shows an embodiment of a device for measuring an ion flow according to the present invention.

FIG. 3 schematically shows an embodiment of a device for measuring an ion flow according to the present invention.

Figure 1:
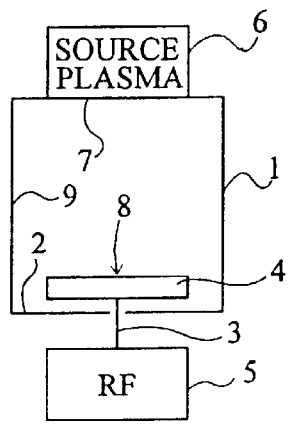
FIGS. 1 and 2, previously described, are meant to show the state of the art and the problem to solve.
Figure 2:
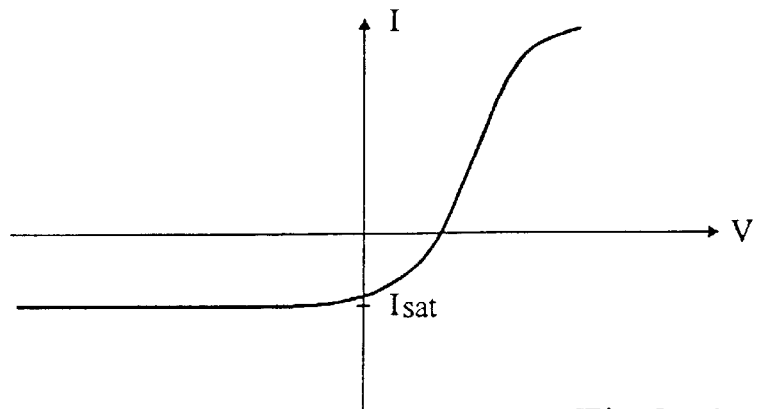

The device is comprised of a probe 10 meant to be placed near a surface towards which the ion flow is desired to be determined, for example, wall 9 (FIG. 1), of a vacuum enclosure (not shown) of a plasma reactor. A sensitive surface 11 of probe 10 is directed towards the inside of the enclosure. According to the present invention, probe 10 is connected to a measuring capacitor 12 having a capacitance $C_m$. A first terminal A of capacitor 12 is connected to a first terminal of a radiofrequency voltage source 13 having a low output impedance (typically 50 ohms), a second terminal of which is connected to the reactor walls and, with the latter, to a reference potential, generally the ground. In the case where the reactor walls are made of a non-conductive material, an electrode with a larger surface than the probe is added to be used as a reference for the measurements. A second terminal B of capacitor 12 constitutes both an input terminal of the device to be connected to probe 10 and an output terminal of the device towards measuring means, for example an oscilloscope 14.

Figure 4:
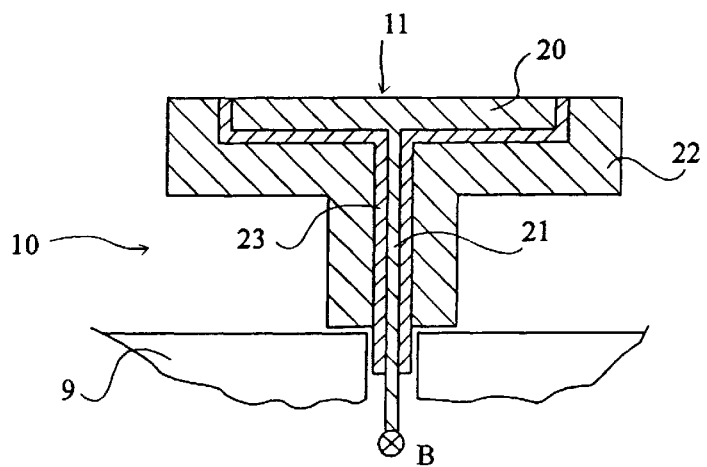
FIG. 4 is a cross-sectional view of an embodiment of a probe of a measurement device according to the present invention such as shown in FIG. 3.

FIG. 4 is a cross-sectional view of an example of an embodiment of probe 10 equipping a measurement device according to the present invention such as shown in FIG. 3.

Probe 10 is comprised of a planar disk 20 meant to be connected, by a conductor 21, to terminal B of the measurement device. Conductor 21 thus runs through the wall (for example, 9) near which probe 10 is placed. The surface of disk 20 directed to the inside of the enclosure constitutes the sensitive surface 11 of the probe. The probe is, preferably, surrounded with a guard ring. This guard ring, intended to avoid the influence of edge effects, is for example comprised of a concentric conductive disk 22, larger and thicker than disk 20. Disk 22 is provided with a cavity in which disk 20 is inserted. The lateral surfaces and the rear surface of disk 20 as well as conductor 21 are insulated from disk 22 by an insulator 23. For disk 22 to better ensure its function of guard ring, it is preferably electrically connected, in a way not shown, to terminal A by a capacitor of value $C_g$ (not shown). For the potential of the guard ring to be always close to the probe potential, $C_g$ will be chosen such that: $C_g/C_m = S_g/S_m$, where $S_g$ and $S_m$ stand for, respectively, the surfaces of the guard ring and of the probe.

According to the present invention, probe 10 is periodically excited by radiofrequency voltage source 13. In other words, source 13 supplies oscillation trains at regular intervals between which the discharge of measuring capacitor 12 can be observed.

FIG. 5 illustrates the shape of the signal applied to terminal A of capacitor 12 by source 13. This drawing shows, in the form of timing diagrams, potential $V_A$ of terminal A. The periodicity $T_h$ of the oscillation trains corresponds, for example, to a frequency $f_h=1/T_h$ between 1 and 20 kHz. The radiofrequency oscillations last a period $T_1$ corresponding, for example, to approximately half ($T_h/2$) the period of the oscillation trains. The measurements are performed within the time interval $T_2$ between two oscillation trains of duration $T_1$. A signal such as shown in FIG. 5 is, for example, obtained by means of a source 13, the output of which is chopped at a frequency $f_h$.

Radiofrequency oscillation frequency $f_o$ is, for example, included between 1 and 20 MHz. For a radiofrequency excited plasma, the value of frequency $f_o$ will be kept sufficiently distant from the frequency of plasma excitation (by source 6 of FIG. 1) to avoid the occurrence of interferences with the plasma potential. As a particular example, for a plasma generated by means of a capacitive coupling generator having a frequency of approximately 13.5 MHz, one will choose, for frequency $f_o$, a frequency between 12 and 15 MHz.

Under the effect of the oscillations issued by source 13 and of the non-linearity of the current (according to the voltage applied) supplied to the probe by the plasma, the mean flow of electrons towards the probe exceeds, initially, the mean flow of positive ions, which causes the loading of capacitor 12. The mean value of the oscillations of the potential of terminal B will decrease until it reaches a negative value corresponding to a potential $V_{bias}$ where the electron flow is decreased to reach a value identical to that of the ion flow, and thus where the mean resulting current in probe 10 is zero. This potential $V_{bias}$ results from the conventional self-biasing effect existing in a plasma.

FIG. 6 illustrates this operation and shows, in the form of a timing diagram, the potential of terminal B of the capacitor 12 in the presence of the plasma. Self-biasing potential $V_{bias}$ corresponds, substantially, to half the peak-to-peak amplitude $V_{CC}$ of the radiofrequency oscillations.

At the end of the oscillation train, that is, when the radiofrequency signal is cut-off, terminal B of capacitor 12 is, after the oscillations have damped, at self-biasing potential $V_{bias}$. Probe 10 then being biased at a strongly negative potential, it is not able to capture electrons. However, the ion flow arriving on surface 11 of probe 10 remains unchanged and starts to discharge capacitor 12. Thus, the potential of terminal B of capacitor 12 will increase linearly until it converges to a floating potential which corresponds to a value $V_f$ where the ion flow and the electron flow compensate each other.

According to the present invention, the discharge rate of capacitor 12 is measured during the linear period where the current is only comprised of the ion flow (the electron flow is zero). These measurements are performed either by observing the time derivative $dV_B/dt$ of the potential at terminal B, or by observing the current $I_B$ flowing towards capacitor 12 by means of a transformer interposed between probe 10 and capacitor 12. For this purpose, for example, an oscilloscope 14 or a specific signal processing circuit is used. The measurements are performed after the radiofrequency oscillations have damped and before the signal variation stops being linear, that is, before the potential at terminal B comes close to floating potential $V_f$.

During the discharge of capacitor 12, the variation of the potential of terminal B follows, as a first approximation, the following relation:

$$dV_B/dt = e \cdot S_m \cdot (\Gamma_{ion} - \Gamma_e)/C_m,$$

where $\Gamma_{ion}$ and $\Gamma_e$ stand for, respectively, the ion flow and the electron flow and where e stands for the charge of an electron.

Electron flow $\Gamma_e$ varies according to potential $V_B$ and becomes zero when potential $V_B$ is strongly negative, as in the case of a planar Langmuir probe.

The amplitude of the radiofrequency signal is chosen to be high enough (for example, of around a few tens of volts) for self-biasing potential $V_{bias}$ to be negative enough to prevent the electrons from being captured by probe 10 during a time sufficient to perform the measurement. This amounts to saying that amplitude $V_{CC}$ of the radiofrequency signal is chosen to be clearly higher than the electronic temperature as expressed in electron-volts.

Thus, as long as the electrons are repelled by the probe since it is at a potential negative enough with respect to potential $V_p$, electron flow $\Gamma_e$ on the probe is zero and the discharge slope of capacitor 12 is proportional to ion flow $\Gamma_{ion}$.

By measuring this slope, by means of oscilloscope 14, the ion flow can be inferred from the following relation:

$$I_B = C_m \cdot dV_B/dt = e \cdot S_m \cdot \Gamma_{ion}.$$

The presence of a plasma depositing a thin insulating layer does not affect the operation of a device according to the present invention. This thin layer appears, from the electrical point of view, as a capacitance $C_i$ (not shown) in series with capacitor 12 between terminal B and the plasma. The consequence of the presence of this capacitance is that the potential measured on terminal B does not correspond to self-biasing potential $V_{bias}$, but to a fraction of this potential due to the series association of capacitor 12 with capacitance $C_i$ of the insulating layer.

The relation which links the potential of terminal B to potential $V_S$ of the probe surface in contact with the plasma, at the time when the radiofrequency signal is cut-off, is:

$$V_B = V_S \cdot C_i / (C_m + C_i).$$

The value of potential $V_S$ at the time when the radiofrequency signal is cut-off is still $V_{bias}$. The initial absolute value of potential $V_B$ will thus be reduced. However, as long as potential $V_S$ remains sufficiently negative, the ion flow and thus the current (identical) flowing through capacitances $C_m$ and $C_i$ remains unchanged. The effects of capacitance $C_i$ of the thin insulating layer are to reduce the absolute value of the potential $V_B$ obtained at the end of the radiofrequency oscillations, to reduce the charge accumulated by capacitor 12 having a capacitance $C_m$ and to reduce the discharge time of capacitor 12 and, accordingly, the linear period during which the measurements can be performed. Conversely, the initial value of the time derivative $dV_B/dt$ remains unchanged and the discharge rate always is, at the beginning, proportional to ion flow $\Gamma_{ion}$ for a high enough amplitude $V_{CC}$ of the radiofrequency signal.

Preferably, capacitance $C_m$ of capacitor 12 is chosen to be lower than the expected capacitance of the thin insulating layer likely to be deposited on probe 10 by the plasma. This has the advantage of increasing the time for which the potential variation on terminal B is exploitable.

The choice of the value of capacitor 12 depends on the electric noise level of the installation with which the device is associated and the desired exploitable discharge time. Indeed, the greater capacitance $C_m$, the slower the discharge of measuring capacitor 12.

If the value of capacitor 12 is too high, the measured potential variation $dV_B/dt$ is too slow and the measurements risk being altered by noise.

If the value of capacitor 12 is too low, its discharge risks being too fast and not leaving enough time to reach a balance of the space charge region in front of the probe, thus resulting in an error in the measurement. The time required for this balance is given by the ion-plasma period: $t_{ion} = (M_i.\epsilon_0/n.e^2)^{1/2}$, where $M_i$ stands for the mass of the ion, $\epsilon_0$ stands for the space permittivity and n stands for the ion density in the plasma.

The value of capacitor 12 is, for example, chosen to be around a few nanofarads. Such a value meets the condition relating to the capacitance of a possible thin insulating layer deposited by the plasma. Indeed, the capacitance of a thin insulating layer with a relative dielectric constant $\epsilon_r$ of 4 and a thickness of 0.1 μm is around 177 nanofarads for a probe of 5 cm$^2$.

The period $T_o=1/f_o$ of the oscillations will be kept short with respect to the time $T_1$ of application of the oscillations, time $T_1$ will be kept long enough to enable a self-biasing of the probe at potential $V_{bias}$ and time interval $T_2$ between two trains of oscillations will be kept long enough to enable the measurement of the discharge rate of capacitor 12.

An advantage of the present invention is that it applies to any plasma chemical composition. Only a very strong chemical attack (etching) of the material(s) forming the probe or a deposition of an insulating layer having a thickness such that it no longer enables to reach a self-biasing of the probe limits the operation of the measurement device.

Another advantage of the present invention is that the results obtained are independent from the chemical nature of the ions gathered by the probe. Indeed, only the electric current is measured, and thus the total flow of positive ions.

Another advantage of the present invention is that it enables control of a deposition or etching method during its implementation. A probe according to the present invention can be placed in the vicinity of an enclosure wall other than that next to which the sample to be processed is placed. The result of the measurement performed by the device according to the present invention can then be used to control the method. If the device detects a slight variation of the ion flow (acceleration or slowing down of the discharge rate of the measuring capacitor), it can issue an order enabling modification of the radiofrequency or microwave gas excitation signal in order to modify the plasma. If the device detects an abrupt fall of the ion flow, it can generate an alarm indicating that the enclosure walls are contaminated. It should be noted that several probes associated with several measurement devices can be distributed next to the enclosure walls to have measurements in different regions of the enclosure.

Another advantage of the present invention is that it enables one to check, in an enclosure characterization phase, the homogeneity of the ion flow in the region of the enclosure meant for receiving a sample to be processed and this, with any plasma. For this purpose, several probes and measurement devices according to the present invention are distributed next to the wall meant for receiving, in normal operation, the sample to be processed. The interpretation of the measurements given by the different devices enables one to draw a map of the distribution of the ion flow next to the wall considered.

According to the present invention, the sensitive surface 11 of probe 10 is relatively large (around several square centimeters). Indeed, the larger the probe surface, the larger the current gathered for a given ion flow. This enables the improvement of signal-to-noise ratio and the time resolution of the probe. Moreover, the edge effects and the effects of possible insulating layers are minimized with a large probe. In an application where several probes are used to establish a mapping of the ion flow with respect to the position, the size of the probes will be adapted (by limiting it) to obtain an adequate spatial resolution.

Another advantage of the present invention is that the measurements are not affected by magnetic fields as long as the gyromagnetic radius of the ion is lower than the size of the probe and as the amplitude and orientation of the magnetic field does not prevent the electrons from reaching the probe, and thus from charging capacitor 12 to establish a self-biasing. The size of probe 10 can thus be adapted to the maximum expected magnetic field. For example, for a probe whose disk has a diameter of 1 cm, the measurements will not be disturbed by magnetic fields lower than 1000 Gauss.

According to a variant of the invention, wafer support 3 (FIG. 1) can be used as an ion flow probe. In this case, the radiofrequency supply (generator 5, FIG. 1) which is used to establish the self-biasing of the substrate and which, in the case of a capacitive coupling reactive ionic etching, feeds the plasma, is chopped and then plays the role of a radiofrequency voltage source 13 according to the present invention. Means similar to those described in relation with FIG. 3 are used to measure the ion flow. Although the implementation of such a variant risks, should it be used, disturbing the processing of the substrate, it enables one to study the possible difference between the flows on the walls and on the wafer support, which can be due to a non-homogeneous distribution of the ion generation regions.

It should also be noted that the present invention enables one to determine the potential of the plasma and the electronic temperature. Indeed, by analyzing the current-voltage characteristic of terminal B when potential $V_B$ comes close to floating potential $V_f$, the probe then can provide parameters characteristic of the plasma, as a conventional Langmuir probe would do.

Of course, the present invention is likely to have various alterations, modifications, and improvements which will readily occur to those skilled in the art. In particular, the materials, dimensions, capacitances and frequencies indicated as an example can be modified, especially according to the plasma reactor for which the device is meant. Further, although reference has been made in the foregoing description to a reactor generating the plasma by means of a capacitive coupling radiofrequency generator, the present invention applies whatever the way of exciting the gas, be it d.c., radiofrequency or microwave. Besides, the present invention also applies to a measurement of flows of charged species present in plasmas other than positive ions, such as aggregates of nanometric sizes or positively-charged dust particles.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for measuring ion flow from a plasma to a surface such as a probe, comprising the steps of:

applying a radio frequency voltage to a first terminal of a measuring capacitor connected between a radio frequency voltage source and a plate-shaped probe in contact with said plasma, whereby said capacitor becomes charged at a self biasing potential of the plasma;

periodically supplying the probe with radio frequency oscillation trains by means of said radio frequency voltage source and performing the measurement of said discharge rate, between two oscillation trains, after the damping of the radio frequency signal and before the potential of the probe is stabilized; and measuring a discharge rate of the capacitor when discharged by the ion flow arriving on the probe.

2. A measurement method according to claim 1, wherein said measurement of said discharge rate is performed by a measurement of the potential variation across the measuring capacitor.

3. A measurement method according to claim 1, wherein said measurement of said discharge rate is performed by a measurement of the discharge current of the measuring capacitor.

4. A measurement method according to claim 1, wherein the value of the measuring capacitance is determined by an external measuring capacitance and the thickness and dielectric constant of a thin film which may be present on the probe.

5. A measurement method according to claim 1, wherein the measuring is used to detect the deposition of insulating layers on the reactor walls.

6. A measurement method according to claim 1, wherein the measuring is used to determine the electronic temperature of the plasma.

7. A device for measuring an ion flow from a plasma to a surface such as a probe in a vacuum enclosure constituting a plasma reactor, including:

a probe internal to the enclosure and including a planar sensitive surface, said probe comprising a disk connected, by a substantially axial conductor, to a terminal of the measuring capacitor, the rear and lateral surfaces of the disk being surrounded by an insulator and a conductive sheath acting as-a screen and a guard ring;

means external to the enclosure for periodically supplying the probe with a radio frequency voltage;

a measuring capacitor external to the enclosure mounted in series between the supplying means and the probe; and means external to the enclosure for periodically measuring the potential variations across the measuring capacitor during its discharge.

8. A measurement device according to claim 7, wherein the sheath is connected to the supplying means via a capacitor.

9. A measurement device according to claim 7, wherein the supplying means are comprised of a radio frequency voltage source which provides radio frequency oscillation trains, said measurement of the potential variations being performed between two of said oscillation trains.

10. A measurement device according to claim 9, wherein the period of the radio frequency oscillations is short with respect to the application time of these oscillations, the application time of the oscillation trains being long enough to establish a self-biasing voltage for the probe and the time interval between two oscillation trains being long enough to enable said measurement of the potential variations.

11. A method for measuring ion flow from a plasma to a surface such as a probe, comprising the steps of:

applying a radio frequency voltage to a first terminal of a measuring capacitor connected between a radio frequency voltage source and a plate-shaped probe in contact with said plasma, whereby said capacitor becomes charged at a self biasing potential of the plasma;

periodically supplying the probe with radio frequency oscillation trains by means of said radio frequency voltage source and performing the measurement of said discharge rate, between two oscillation trains, after the damping of the radio frequency signal and before the potential of the probe is stabilized; and measuring a discharge rate of the capacitor when discharged by the ion flow arriving on the probe, wherein the value of the measuring capacitance is lower than the value of the capacitance of a thin layer deposited by the plasma on the probe.

* * * * *